United States Patent [19]
Friend

[11] 3,941,442
[45] Mar. 2, 1976

[54] DAUGHTER BOARD CONTACT

[75] Inventor: Lindsay Carlton Friend, Camp Hill, Pa.

[73] Assignee: E. I. Du Pont de Nemours and Company, Wilmington, Del.

[22] Filed: June 24, 1974

[21] Appl. No.: 482,366

Related U.S. Application Data
[62] Division of Ser. No. 404,290, Oct. 9, 1973.

[52] U.S. Cl. ............................................. 339/17 M
[51] Int. Cl.$^2$ ......................................... H01R 13/54
[58] Field of Search ............ 339/17 R, 17 C, 17 LC, 339/17 LM, 17 M, 176 MP, 275 R, 275 B

[56] References Cited
UNITED STATES PATENTS

| | | | |
|---|---|---|---|
| 3,066,367 | 12/1962 | Garman | 339/17 M |
| 3,479,634 | 11/1969 | Pritulsky | 339/275 B X |
| 3,617,980 | 11/1971 | Alkire | 339/17 R X |
| 3,696,323 | 11/1972 | Kinkaid et al. | 339/17 C |
| 3,754,203 | 8/1973 | Pauza et al. | 339/176 MP X |
| 3,790,916 | 2/1974 | Keitel | 339/176 MP |

FOREIGN PATENTS OR APPLICATIONS

| | | | |
|---|---|---|---|
| 1,075,691 | 2/1960 | Germany | 339/17 LM |

*Primary Examiner*—Joseph H. McGlynn
*Assistant Examiner*—Craig R. Feinberg
*Attorney, Agent, or Firm*—Thomas Hooker

[57] ABSTRACT

An electrical connection between spaced and parallel mother and daughter boards including terminals secured to the mother board and projecting toward the daughter board having a pivot link arm with a daughter board-engaging member at the free end of the link arm and a daughter board spring contact. A number of terminals are secured to the mother board all facing in the same direction so that upon movement of the daughter board in a direction parallel to the mother board the links pivot the daughter board down toward the mother board and bring contact pads on the daughter board in engagement with the spring contacts.

1 Claim, 5 Drawing Figures

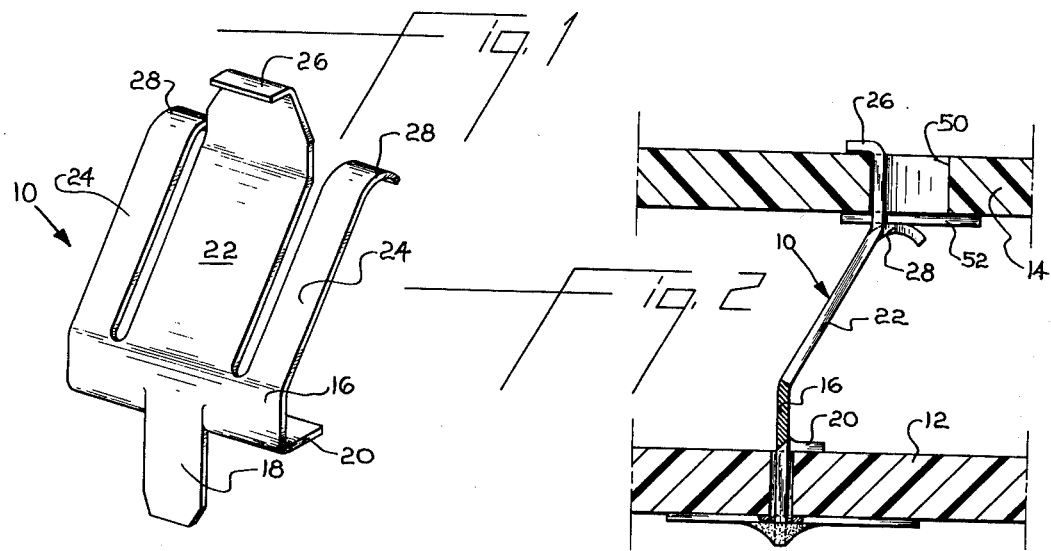
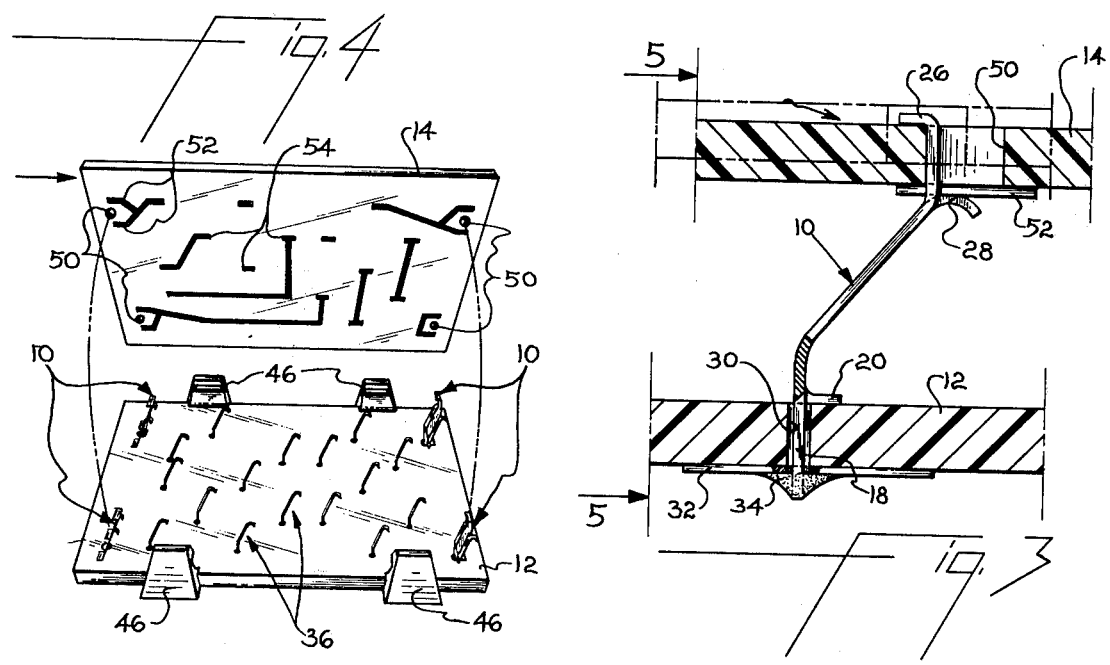
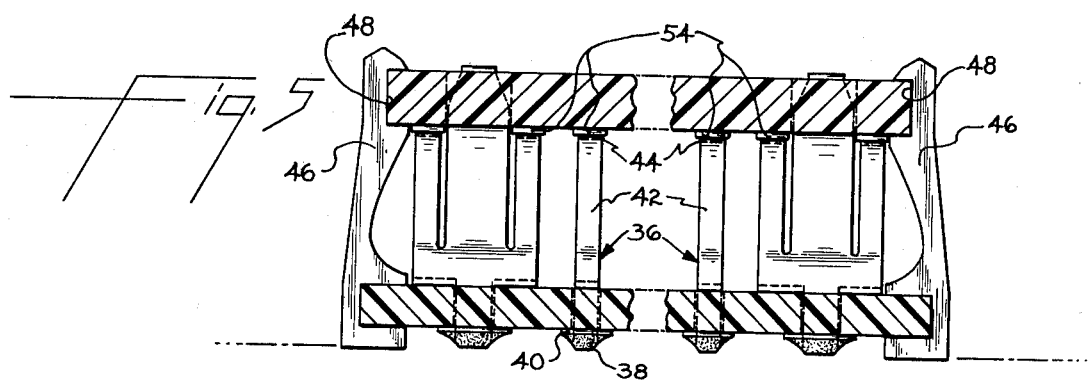

DAUGHTER BOARD CONTACT

This application is a division of my co-pending application for "Daughter Board Contact," U.S. Ser. No. 404,290, filed Oct. 9, 1973.

The invention relates to a connection system for two parallel circuit boards, commonly referred to as mother and daughter boards. The daughter board is removably mounted on the mother board in electrical engagement with circuitry on the mother board. Landman, U.S. Pat. No. 3,701,071 discloses a connector for forming an electrical connection between spaced parallel mother and daughter boards. The invention disclosed herein is directed to a different type of connection system for parallel mother and daughter boards.

According to the invention, terminals are secured on the mother board and include link arms having hooks at the free ends of the arms engagable with the daughter board overlying the mother board. The terminals all include spring contacts so that when the daughter board is laid on top of the terminals and engages the hooks, lateral movement of the board pivots the board about the link arms and brings contact pads on the surface of the daughter board adjacent the mother board into engagement with the spring contacts on the terminals. The hooks hold the daughter board down. Additionally, other spring contacts may be secured to the mother board for forming electrical connections with other contact pads at desired locations on the daughter board. Latches or other types of detents may be provided for holding the daughter board in electrical engagement with the spring contacts of the terminals and the additional spring contacts.

Ohter objects and features of the invention will become apparent as the description proceeds, especially when taken in conjunction with the accompanying drawings illustrating the invention, of which there is one sheet.

IN THE DRAWINGS

FIG. 1 is a perspective view of a terminal used for forming electrical connections between spaced parallel mother and daughter boards;

FIG. 2 is a sectional view taken through the terminal of FIG. 1 illustrating the mother and daughter boards with the daughter board in initial engagement with the terminal;

FIG. 3 is a view similar to that of FIG. 2 showing the mother and daughter boards with a terminal in electrical connection with a pad on the daughter board;

FIG. 4 is a view illustrating the mother and daughter boards with the daughter board in position to be mounted on the terminals on the mother board; and FIG. 5 is a view, partially broken away, taken along line 5—5 of FIG. 3 illustrating the closed mother and daughter boards.

The daughter contact 10 illustrated in FIG.1 forms a physical and electrical connection between spaced and parallel mother board 12 and daughter board 14. The terminal 10 includes a base 16, a solder tab 18 extending from the base 16, a pair of supports 20 extending to one side of the base 16, a pivot link arm 22 extending at an angle from the edge of the base away from tab 18, and a pair of cantilever spring contact arms 24 to either side of the pivot link arm 22. A daughter board engaging hook 26 is provided at the free end of the link arm and electrical contacts 28 are provided at the free ends of the cantilever spring arms 24. The terminal 10 is preferably stamp formed from sheet metal stock of high yield strength.

As illustrated in FIG. 4, a number of spaced terminals 10 are mounted on the mother board 12 with the solder tabs 18 of the terminals extending through circuit board holds 30 in the mother board and secured to printed circuit 32 on the bottom of the mother board by solder connections 34. The supports 20 of each terminal rest flush on the top of the mother board to prevent movement of the base during the formation of the electrical connections between the mother and daughter board. The terminals 10 are mounted on mother board 12 so that the pivot link arms 22 and cantilever contact arms 24 all extend in the same direction. As illustrated in FIG. 4, the arms all extend to the right hand side of the mother board.

In addition to terminals 10, a number of individual contact terminals 36 are also secured to the mother board 12. Each of these terminals includes a solder tab 38 extending through a circuit board hole and soldered to printed circuitry 40 on the bottom of the circuit board of the mother board, and a single cantilever spring arm 42 joining the tab and extending away from the top of the mother board in the same direction as the link and spring arms of terminals 10. As illustrated in FIG. 4, the contact arms 42 also extend to the right of the mother board. Contacts 44 are provided at the free ends of the spring arms 42. Spring arms 42 are the same length as arms 24.

Daughter board latches 46 are secured to the edges of the mother board 12 and include daughter board receiving recesses 48. The terminal arms 22 and 24 and contact arms 42 normally project above the lower edges of recesses 48.

As shown in FIG. 4, the terminals 10 are spaced from each other on the mother board 12. Hook-receiving openings 50 are provided in the daughter board with an opening above each terminal 10. Contact pads 52 to either side of openings 50 are provided for electrical connection with the contacts 28 on arms 24. Additionally, a number of contact pads 54 are provided on the daughter board in position for forming electrical connections with the contacts 44 of contact arms 36.

The daughter board is brought into electrical connection with the mother board by first positioning the daughter board parallel to and above the mother board with the hooks 26 of terminals 10 extending through the openings 50 so that they engage the top of the daughter board. In this posiiton, the daughter board rests lightly upon contacts 28 and 44. The daughter board is then pushed to the right so that it pivots about the link arms 22 of the spaced terminals 10 and is brought down toward the mother board so that the spring arms 24 of terminals 10 and the arms 42 of contacts 36 are bent down and stressed and their respective contacts 28 and 44 are biased against the contact pads 52 and 54 on the daughter board. Terminals 10 are bent at each end of link arms 22. Thus, the daughter board is pivoted to one side and moved down about the arms 22 toward the mother board and engages flexible latches 46. The latches are bent outwardly from the mother board and then snap back to secure the daughter board in the position of FIG. 5 with daughter board contact pads 52 and 54 in electrical connection with the arms 24 and 36 of the mother board. The daughter board may be released from the mother board by opening the latches 46.

While terminals 10 disclosed herein include a single link arm 22 and a pair of contact arms 24, it is obvious that connections may be formed between the mother and daughter boards as disclosed through the use of a contact and connection system having a number of link arms and a number of contact arms, whether or not the contact arms are integral with the link arms.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What I claim as my invention is:

1. A daughter board contact terminal comprising a base, circuit contact means on the base, a flexible pivot link arm extending away from said base in a first direction and having daughter board-engaging hook means on the free end thereof, and a pair of flexible cantilever spring contact arms spaced apart from said link arm and extending from said base in the same direction as said link arm and having contacts at the free ends thereof both located adjacent said daughter board-engaging hook means for engaging a contact pad on the daughter board, the pivot link arm being located between said contact arms.

* * * * *